United States Patent
Ukawa et al.

(10) Patent No.: US 9,755,123 B2
(45) Date of Patent: Sep. 5, 2017

(54) LIGHT EMITTING DEVICE AND METHOD OF MANUFACTURING THE LIGHT EMITTING DEVICE

(71) Applicant: NICHIA CORPORATION, Anan-shi, Tokushima (JP)

(72) Inventors: Hiroaki Ukawa, Itano-gun (JP); Daigo Hiraoka, Myozai-gun (JP)

(73) Assignee: NICHIA CORPORATION, Anan-Shi (JP)

( * ) Notice: Subject to any disclaimer, the term of this patent is extended or adjusted under 35 U.S.C. 154(b) by 0 days.

(21) Appl. No.: 15/177,071

(22) Filed: Jun. 8, 2016

(65) Prior Publication Data

US 2016/0365494 A1    Dec. 15, 2016

(30) Foreign Application Priority Data

Jun. 10, 2015  (JP) .................................. 2015-117621

(51) Int. Cl.
*H01L 33/00* (2010.01)
*H01L 33/56* (2010.01)
(Continued)

(52) U.S. Cl.
CPC .............. *H01L 33/56* (2013.01); *H01L 33/44* (2013.01); *H01L 33/62* (2013.01);
(Continued)

(58) Field of Classification Search
USPC ....................... 257/13, 40, 79–103, 918, 191, 257/E51.018–E51.022, E33.001–E33.077,
(Continued)

(56) References Cited

U.S. PATENT DOCUMENTS

2010/0136308 A1    6/2010  Hwang et al.
2011/0006323 A1*   1/2011  Suzuki ................. H01L 33/504
                                                        257/98
(Continued)

FOREIGN PATENT DOCUMENTS

| JP | 2008-072013 A | 3/2008 |
| JP | 2010-533084 A | 10/2010 |
| JP | 2011-100905 A | 5/2011 |
| JP | 2011-204986 A | 10/2011 |
| JP | 2011-253846 A | 12/2011 |
| JP | 2012-069539 A | 4/2012 |
| JP | 2014-195126 A | 10/2014 |
| JP | 2015-23081 A | 2/2015 |
| WO | WO 2014/162642 A1 | 10/2014 |

*Primary Examiner* — Tram H Nguyen
(74) *Attorney, Agent, or Firm* — Foley & Lardner LLP

(57) ABSTRACT

A light emitting device includes a base member including a conductive member; a light mining element arranged on the base member, the light emitting element having a first surface, a second surface opposing the first surface, and at least one lateral surface between the first surface and the second surface; a die-bonding resin bonding the base member and the second surface; a first protective film continuously covering the base member, the die-bonding resin, the at least one lateral surface, and the first surface; and a second protective film continuously covering the base member, the die-bonding resin, the at least one lateral surface and the first surface of the light emitting element, over the first protective film, the second protective film having a linear expansion coefficient that is smaller than a linear expansion coefficient of the die-bonding resin and larger than a linear expansion coefficient of the first protective film.

13 Claims, 6 Drawing Sheets

(51) Int. Cl.
*H01L 33/44* (2010.01)
*H01L 33/62* (2010.01)

(52) U.S. Cl.
CPC ............... *H01L 2224/48091* (2013.01); *H01L 2224/48137* (2013.01); *H01L 2224/48471* (2013.01); *H01L 2224/73265* (2013.01); *H01L 2224/8592* (2013.01); *H01L 2224/92247* (2013.01); *H01L 2933/005* (2013.01); *H01L 2933/0025* (2013.01)

(58) Field of Classification Search
USPC .. 257/E33.054, E25.028, E25.032, E31.058, 257/E31.063, E31.115, E27.133–E27.139; 438/22–47, 69, 493, 503, 507, 956
See application file for complete search history.

(56) References Cited

U.S. PATENT DOCUMENTS

| | | | |
|---|---|---|---|
| 2012/0049225 A1* | 3/2012 | Wakaki | ................... H01L 33/44 257/98 |
| 2012/0193768 A1 | 8/2012 | Hwang et al. | |
| 2014/0151737 A1 | 6/2014 | Wakaki | |
| 2015/0023026 A1 | 1/2015 | Sakamoto et al. | |
| 2015/0280077 A1 | 10/2015 | Wakaki | |
| 2016/0053974 A1 | 2/2016 | Hino | |

\* cited by examiner

LIGHT EMITTING DEVICE AND METHOD OF MANUFACTURING THE LIGHT EMITTING DEVICE

CROSS-REFERENCE TO RELATED APPLICATION

This application claims priority to Japanese Patent Application No. 2015-117621 filed on Jun. 10, 2015. The entire disclosure of Japanese Patent Application No. 2015-117621 is hereby incorporated herein by reference.

BACKGROUND

The present disclosure relates to a light emitting device and a method of manufacturing the light emitting device.

In a light emitting device including a base member and a light emitting element on the base member, a conductive member such as a wiring pattern or a lead for supplying electricity is arranged on the base member. In order to prevent the conductive member from discoloration due to sulfurization or the like, a protective film is formed on a conductive layer or the light emitting element as needed. If discoloration of the conductive member occurs, a light reflectivity of the conductive member may decrease, and an amount of light emitted from the light emitting device and reflected on the conductive member to be extracted from the light emitting device may be decreased, which may lead to a decrease in the light output of the light emitting device.

Accordingly, a protective film is required with which discoloration of the conductive layer can be suppressed even after long-time use, and reduction of the light output of the light emitting device can be suppressed for a long period. As a protective film fulfilling such requirement, JP 2014-195126A discloses a protective film made of silicon oxide ($SiO_2$) covering an Ag-plating layer.

SUMMARY

Even when using a protective film such as that disclosed in JP 2014-195126A, depending on an operating condition, such as an operating environment or an operating time, moisture may enter the light emitting element, and the light emitting element may be corroded. Accordingly, an amount of light extracted from the light emitting element may be decreased; that is, the light output of the light emitting element may be decreased, or the light emitting element may cease to emit light. It is an object of the present disclosure to provide a light emitting device with which ingress of moisture to a light emitting element is prevented to suppress decrease of light output of the light emitting device for a long period, and a method of manufacturing thereof.

A light, emitting device according to one embodiment of the present invention includes a base member including a conductive member, a light emitting element arranged on the base member and having a first surface, a second surface opposite to the first surface, a lateral surface between the first surface and the second surface, a die-bonding resin bonding the base member and the second surface, a first protective film continuously covering the base member, the die-bonding resin, the lateral surface, and the first surface, a second protective film continuously covering the base member, the die-bonding resin, the lateral surface, and the first surface. The second protective film has a linear expansion coefficient that is smaller than a linear expansion coefficient of the die-bonding resin and larger than a linear expansion coefficient of the first protective film.

According to the light emitting device of certain embodiments of the present invention, entry of moisture into the light emitting element can be prevented, and decrease of light output of the light emitting device can be suppressed for a long period. Also, according to a manufacturing method of certain embodiments of the present invention, a light emitting device can be obtained with which entry of moisture into a light emitting element, can be prevented and a decrease of the light output of the light emitting element can be suppressed for a long period.

DETAILED DESCRIPTION

Figure 1:
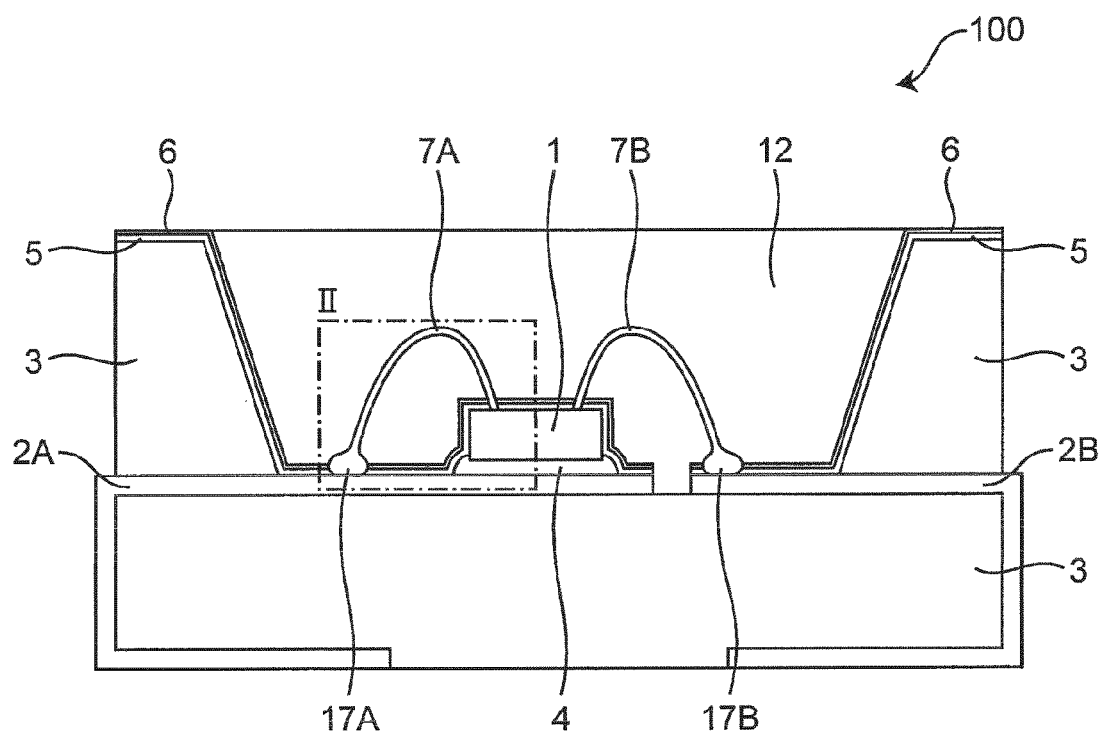
FIG. 1 is a schematic cross-sectional view of a light emitting device 100 according to Embodiment 1.

Embodiments of the present invention will be described in detail below with reference to the drawings. In the description below, when appropriate, terms which indicate specific directions or locations (for example, "up", "down", and other terms including those) may be applied, but those terms are used for easy understanding of the disclosure with reference to the accompanying drawings, and thus the technical scope of the disclosure shall not be limited by the meaning of those terms. The same numerals in different drawings indicate the same or similar portions or members. Further, embodiments described below are intended as illustrative of a light emitting device and a method of manufacturing the light emitting device to give a concrete form to technical ideas of the present invention, and the scope of the present invention is not limited to those described below. Particularly, the sizes, materials, shapes and the relative positions of the members described in embodiments are given as an example and not as a limitation to the scope of the invention unless specifically stated. The sizes and the positional relationships of the members in each of the drawings are occasionally shown exaggerated for ease of understanding.

The inventors have found that entry of water into the light emitting element is caused by a crack generated in a protective film when temperature increases during a reflow process for mounting a light emitting device, and that the generation of the crack is due to a difference between a linear expansion coefficient of a die-bonding resin, which is used for bonding a light emitting element and a base member and made of silicone-based resin, epoxy-based resin, or the like, and a linear expansion coefficient of a protective film made of an inorganic material such as aluminum oxide. In the case of bonding a light emitting element to a base member, a die-bonding resin made of silicone-based or epoxy based resin is often employed for a bonding material because it is easy to handle. On the other hand, an inorganic material such as an oxide is often employed for a protective film because the protective film requires properties such as durability and electrical insulation. Materials typically used for the die-bonding resin, as described below, have a linear expansion coefficient that is larger than a linear expansion coefficient of be protective film. In a reflow operation for mounting the light emitting device to a mounting substrate or the like, heating is performed up to about 200° C. or more. An amount of thermal expansion of the die-bonding resin caused by this heating is larger than that of the protective film. Accordingly, tensile stress applied on a portion of the protective film that is on the die-bonding resin, which may cause generation of a crack. Further, moisture entering through the crack may corrode the light emitting element.

The inventors have studied further, and have found that, with a protective film made of two layers having linear expansion coefficients that fulfills a predetermined condition, generation of a crack can be prevented. More specifically, a first protective film having a linear expansion coefficient smaller than that of a die-bonding resin is arranged on the die-bonding resin, and on this first protective film, a second protective film having a linear expansion coefficient that is smaller than that of the die-bonding resin and larger than that of the first protective film is arranged. With this arrangement, the thermal expansion of the second protective film is larger than that of the first protective film. Accordingly, when the light emitting device is heated in the reflow operation, compressive stress is applied to the second protective film, which is arranged on an outer side, i.e., on a side where a crack may be easily generated. As a result, a generation of the crack in the protective film in a reflow operation can be prevented. Thus, entry of moisture into the light emitting element can be prevented, so that decrease in light output of the light emitting device can be suppressed for a long period.

It is noted that, although the inventors have studied the above-mentioned mechanism of being able to prevent entry of water into view of embodiments of the present invention, the description of this mechanism does not limit the technical scope of the present invention. Embodiments according to the present invention will be described below.

1. Embodiment 1

1-1. Light Emitting Device 100

Figure 2A:
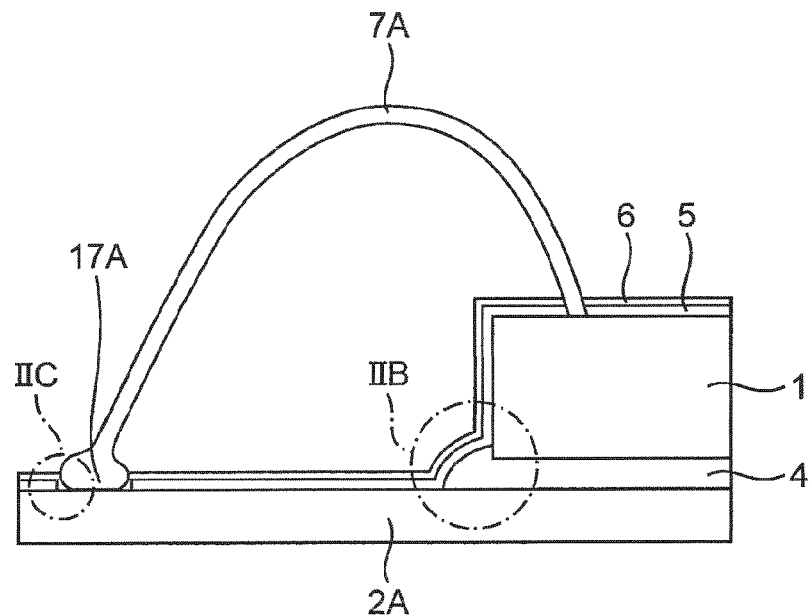
FIG. 2A is an enlarged view of the region of FIG. 1 enclosed by a dotted line II.
Figure 2B:
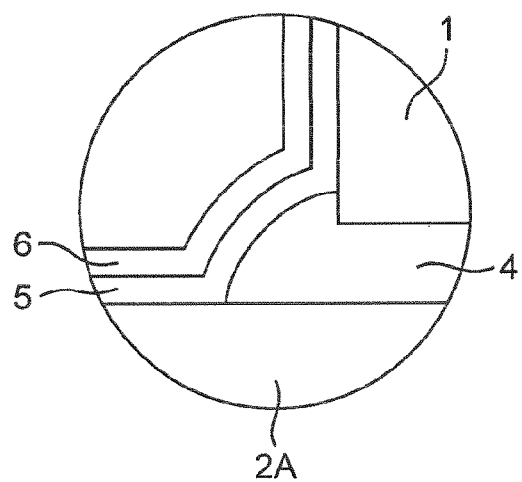
FIG. 2B is an enlarged view of the region of FIG. 2A enclosed by a dotted line IIB.
Figure 2C:
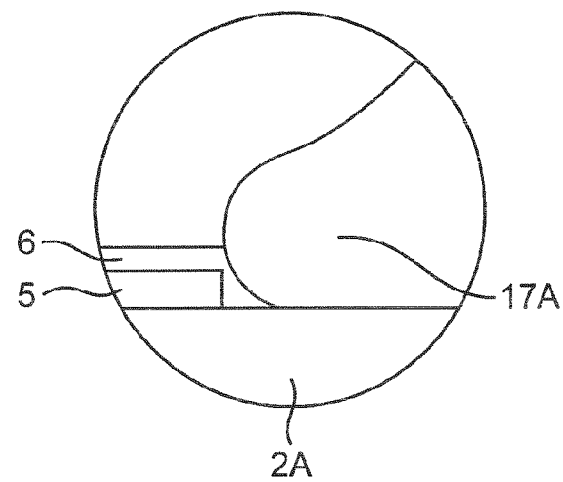
FIG. 2C is an enlarged view of the region of FIG. 2A enclosed by a dotted line IIC.

FIG. 1 is a schematic cross-sectional view of a light emitting device 100 according to Embodiment 1. FIG. 2A is an enlarged view of the region of FIG. 1 enclosed by a dotted line II. FIG. 2B is an enlarged view of the region of FIG. 2A enclosed by a dotted line IIB, and FIG. 2C is an enlarged view of the region of FIG. 2A enclosed by a dotted line IIC. The light emitting device 100 includes a package (a resin package) 3 including a conductive member (a lead) 2A and 2B, a light emitting element 1, a first protective film 5, and a second protective film 6.

In the description below, based on an embodiment in which description is given with reference to FIG. 1 and FIGS. 2A to 2C, the case where the base member 3 is the resin package 3 including the lead 2A and the lead 2B that serve as the conductive member. However, this is not limited thereto, but the base member 3 may be in any appropriate form including a conductive member. Examples of such form include a resin substrate or a ceramic substrate including a wiring pattern on its surface or inside, a ceramic package with the lead serving as the conductive member, and a metal base member. Further, on a surface of the conductive member 2A and 2B, a reflective film may be arranged. Examples of such reflective film include a metal film made of silver, silver alloy, aluminum, aluminum alloy, or the like.

The resin package 3 includes a recess, and the lead 2A and the lead 2B is exposed from a bottom surface of the recess. A lower surface (a second surface) of the light emitting element 1 is bonded to the resin package 3 with a die-bonding resin 4. In FIG. 1, the light emitting element 1 is arranged in the recess of the resin package 3. More specifically, the light emitting element 1 is arranged on a portion of the lead 2A that is exposed from the bottom surface of the recess of the resin package 3. In order to bond the light emitting element 1 and the base member 3 (lead 2A) more securely, as shown in FIG. 1 and FIGS. 2A to 2C, the die-bonding resin 4 can be arranged to extend to outside of the lower surface of the light emitting element. Also, a portion of the die-bonding resin 4 located outside of the lower surface of the light emitting element 1 can cover a portion of a lateral surface of the light emitting element 1 as shown in FIG. 1 and FIGS. 2A to 2C.

The light emitting element 1 is electrically connected to the lead 2A via a wire 7A. One end of the wire 7A is connected to the lead 2A via a bump 17A arranged on the lead 2A, and the other end of the wire 7A is wire-bonded to one of a positive electrode and a negative electrode that are arranged on an upper surface (a first surface) of the light emitting element 1. The light emitting element 1 is electrically connected to the lead 2B via a wire 7B. One end of the win 7B is connected to the lead 2B via a bump 17B arranged on the lead 2B, and the other end of the wire 7B is wire bonded to the other of the positive electrode and the negative electrode arranged on the upper surface (the first surface) of the light emitting element 1.

First Protective Film and Second Protective Film

A first protective film 5 continuously covering the base member (resin package) 3, the die-bonding resin 4, lateral surfaces of the light emitting element 1, and the upper surface (first surface) of the light emitting element is arranged. On the first protective film 5, a second protective film 6 is arranged so as to continuously cover the base member (resin package) 3, the die-bonding resin 4, the lateral surfaces of the light emitting element 1, and the upper surface (first surface) of the light emitting element over the first protective film 5.

As described above, a linear expansion coefficient of the first protective film 5 is smaller than a linear expansion coefficient of the die-bonding resin 4. Also, a linear expansion coefficient of the second protective film 6 is smaller than a linear expansion coefficient of the die-bonding resin 4, and is larger than the linear expansion coefficient of the first protective film 5. With this arrangement, generation of a crack in the protective film (i.e., the first protective film 5 and the second protective film 6) arranged on a die-bonding resin 4 can be reduced. Note that the "linear expansion coefficient" in the present specification refers to a linear expansion coefficient at a room temperature (e.g., at 25° C.). In the case where it is difficult to directly measure the linear expansion coefficient of each of the first protective film 5 and the second protective film 6, the relationship between the linear expansion coefficient of the first protective film 5 and that of the second protective film 6 may be defined using a literature value of linear expansion coefficient at room temperature or at a temperature in the vicinity of room temperature (e.g., a linear expansion coefficient at any temperature in a range of 0° C. to 35° C.) of a material same as the material of the first protective film 5 and that of a material same as the material of the second protective film 6. Also, it may be possible that, with use of a material same with the material for the first protective film 5 and a material same with the material for the second protective film 6, samples of these films each having a measurable shape are prepared, the linear expansion coefficient of each of the samples is measured, and the relationship between the linear expansion coefficient of the first protective film 5 and that of the second protective film 6 is confirmed using the obtained values.

Examples of a material for a protective film that can be used as the first protective film 5 or the second protective film 6 include aluminum oxide, silicon nitride, aluminum nitride, titanium oxide, and tantalum oxide. For example, from these materials, materials for the first protective film 5 and the second protective film 6 can be respectively selected so that the linear expansion coefficient of the second protective film 6 is larger than the linear expansion coefficient of the first protective film 5. Note that materials for the first protective film 5 and the second protective film 6 are not limited to these materials.

The linear expansion coefficient of the second protective film 6 may be more than five times as large as the linear expansion coefficient of the first protective film 5, and more preferably, may be more than ten times as large as that. With such a large difference in the linear expansion coefficient, generation of a crack can be reduced more securely. Further, an inorganic material such as an oxide (e.g., metal oxide; examples of "metal" as used herein include silicon) may be used for the protective film. In this case, a difference between the linear expansion coefficient of the protective film and that of the die-bonding resin tends to be large. For example, the linear expansion coefficient of the die-bonding resin 4 may be more than fifty times as large as the linear expansion coefficient of the first protective film 5, and further, may be more than one hundred times as large as that. Examples of preferable combination of the linear expansion coefficients of these protective films include, the linear expansion coefficient of the first protective film 5 in a range of 0.4 ppm to 0.8 ppm, more preferably 0.5 ppm to 0.7 ppm, the linear expansion coefficient of the second protective film 6 in a range of 6 ppm to 9 ppm, more preferably 7 ppm to 8 ppm, and the linear expansion coefficient of the die-bonding resin in a range of 180 ppm to 240 ppm, more preferably 200 ppm to 220 ppm. Further, examples of preferable materials for the die-bonding resin include a silicone-based die-bonding resin and an epoxy-based die-bonding resin. The first protective film 5 and the second protective film 6 preferably has a high light-transmissivity with respect to light emitted from the light emitting element 1 (in the case of using a wavelength-converting material, also with respect to light emitted from the wavelength converting material)

Among the materials described above, preferable combination is silicon oxide for the first protective film 5 and aluminum oxide for the second protective film 6. With this combination, silicone-based die-bonding resin may be used for the die-bonding resin 4. This combination can fulfill the range of the combination of preferable values of the linear expansion coefficients described above. As well as that, in the case of using a silicon oxide for the first protective film 5, a crack less easily generates in the silicon oxide even in the case where tensile stress is applied from the die-bonding resin 4 in a reflow operation. On the other hand, aluminum oxide has a great shielding performance with respect to moisture (water vapor).

In the formation of the of aluminum oxide film by using Atomic Layer Deposition (ALD) method, the second protective film can be formed using gases. Accordingly, this method has an advantage that a film (the second protective film) can be securely formed even in the case where an obstacle such as a light emitting element or a wire is present on a straight line connecting a supplying source of a film-forming material and a portion of a member on which a film is to be formed, which is different from a method in which a film-forming material transfers highly rectilinearly from a supplying source of a film-forming material to a portion of a member on which a film is to be formed, such as sputtering. That is, with this method, the second protective film 6 made of an aluminum oxide, which has a good shielding performance with respect to moisture, can be securely formed also on a portion shaded by the obstacle. With this formation of the second protective film 6, corrosion and disconnecting of the wire can be reduced, which can suppress decrease in light output for a long period.

Also, in the atomic layer deposition method, a step of forming one thin film is repeatedly performed to form a film in which a plurality of the thin films are layered. With this method, a dense film having fewer pinholes compared to a film formed using sputtering can be formed. That is, the second protective film is preferably formed using the atomic layer deposition method, with which a protective film having less defects can be formed.

On the other hand, the first protective film 5 of silicon oxide may also be formed using atomic layer deposition method. Alternatively, forming the first protective film 5 of silicon oxide using sputtering has an advantage that the adhesion of the film can be good and that the film formation can be performed with low cost (i.e., high productivity).

If the protective film has a thickness that is too small, moisture may penetrate the film. Or vice versa, if the protective film has a thickness that is too large, light-transmissivity of the film may be decreased. The first protective film 5 and the second protective film 6 may respectively have an appropriate thickness, and it is preferable that the thickness of the first protective film 5 is larger than the thickness of the second protective film 6. With the thickness of the first protective film 5 larger than the thickness of the second protective film 6, generation of a crack in the protective film 5 can be reduced. The first protective film 5 preferably has a thickness in a range of 40 nm to 80 nm, and the second protective film 6 preferably has a thickness in a range of 40 nm to 60 nm. With such thicknesses, the first protective film 5 and the second protective film 6 are less likely to transmit moisture and have a high light-transmissivity. Note that, the expression of "have a high light transmissivity" refers to transmit 70% or more of light emitted from the light emitting element.

For example, in the case of forming the first protective film 5 by sputtering or plating, a pinhole may be generated in the first protective film 5. In this case, forming the second protective film 6 by, for example, atomic layer deposition method allows for forming the second protective film 6 in the pinhole formed in the first protective film 5. In this manner, in the case where the pinhole in the first protective film is filled with the second protective film, entry of sulfide or moisture into the light emitting element 1 can be reduced more securely.

In addition to selecting relationship among the linear expansion coefficient of the die-bonding resin 4 as described above, that of the first protective film 5, and that of the second protective film 6, it is preferable to selecting the relationship among an elastic modulus of the die-bonding resin 4, that of the first protective film 5, and that of the second protective film 6. More specifically, it is preferable that an elastic modulus of the first protective film is higher than an elastic modulus of the die-bonding resin 4, and an elastic modulus of the second protective film 6 is higher than an elastic modulus of the first protective film 5. With a high elastic modulus value (Young's modulus) of a component, a degree of deformation of the component to which stress is applied can be small. That is, selecting the elastic modulus of the first protective film 5 so as to be between the elastic modulus of the die-bonding resin 4 and the elastic modulus of the second protective film 6 can reduce difference in an amount of deformation among these members, so that generation of a crack in the second protective film 6 can be reduced. Examples of combination of preferable ranges of elastic modulus of these members include, 69 GPa to 76 Gpa as an elastic modulus of the first protective film 5, 350 Gpa to 420 Gpa as an elastic modulus of the second protective film 6, and 0.11 Gpa to 0.13 Gpa as an elastic modulus of the die-bonding resin 4. Such range of elastic modulus can be realized in the case where the first protective film is made of silicon dioxide, the second protective film 6 is made of aluminum oxide, and the die-bonding resin 4 is made of silicone-based die-bonding resin.

Next, a portion on which the first protective film 5 and the second protective film 6 are to be formed is described below. In view of being able to reduce a crack in the protective film more securely, it is preferable that an entirety of an exposed portion of the die-bonding resin 4 is covered by the first protective film and the second protective film. The second protective film 6 preferably covers an entirety of an exposed portion of the die-bonding resin 4 via the first protective film 5. That is, as illustrated in FIG. 1 and FIGS. 2A to 2C (particularly, in the enlarged view illustrated in FIG. 2B), it is preferable that a portion of a surface of the die-bonding resin 4 that is outside of the light emitting element 1 (e.g., outside of the light emitting element 1 in plan view) and is not in contact with the upper surfaces of the leads 2A and 2B or the lateral surface of the light emitting element 1 is entirely covered by the first protective film 5 and the second protective film 6. Also, it is preferable that the second protective film 6 covers the portion of a surface of the die-bonding resin 4 that is outside of the light emitting element 5 and is not in contact with the lower surface of the resin package 3 or a lateral surface of the light emitting element 1 is preferably covered by the first protective film 5 and the second protective film 6 via the first protective film 5.

Portions of the lateral surfaces and the upper surfaces that are exposed from the die-bonding resin 4 are preferably covered by the protective films. With this arrangement, entry of moisture can be prevented with more certainty. In this case, at least one of the first protective film 5 and the second protective film 6 may cover the entirety of exposed portions of the lateral surfaces and the upper surfaces. For example, the portions of the exposed portions of the lateral surfaces and the upper surface of the light emitting element 1 may be covered by one of the first protective film 5 and the second protective film 6, and the other portion of the exposed portions of the lateral surfaces and the upper surface of the light emitting element 1 is covered by both of the first protective film 5 and the second protective film 6. In the case of covering the portions of the exposed portions of the lateral surfaces and the upper surfaces of the light emitting element 1 by both the first protective film 5 and the second protective film 6, it is preferable that the second protective film 6 covers these portions via the first protective film 5. In the case of covering the exposed portions of the lateral surfaces and the upper surfaces of the light emitting element 1 by one of the first protective film 5 and the second protective film 6, it is preferable to cover these portions by the second protective film 6 as long as the second protective film 6 has less pinholes than that of the first protective film 5 (for example, in the case where the second protective film is made of aluminum oxide).

In the resin package 3, an entirety of the portion of the surface of the lead 2A and 2B that is exposed from the bottom surface of the recess of the resin package 3 is preferably covered by the protective film. Also, it is further preferable that a top surface of the resin package 3 and inner surfaces (i.e., lateral surfaces and a bottom surface) of the recess of the resin package 3 are entirely covered by the protective film as shown in FIG. 1. With this arrangement, discoloration of the conductive member can be reduced more securely. In this case, at least one of the first protective film 5 and the second protective film 6 may cover the entirety of exposed portions of the lateral surfaces and the upper surfaces. For example, it may be also possible that a portion of the top surface of the resin package 3 and a portion of the inner surfaces of the recess of the resin package 3 is covered by one of the first protective film 5 and the second protective dim 6, and the other portion of the top surface of the resin package 3 and the other portion the inner surfaces of the recess of the resin package 3 are covered by both of the first protective film 5 and the second protective film 6 (via the first protective film 5). In the case of covering the exposed portions of the lateral surfaces and the upper surfaces of the light emitting element 1 by one of the first protective film 5 and the second protective film 6, it is preferable to cover these portions by the second protective film 6 as long as the second protective film 6 has less pinholes than that of the first protective film 5 (for example, in the case where the second protective film is made of aluminum oxide).

In the embodiment shown in FIG. 1 and FIGS. 2A to 2C, in the portion of the surface of each of the lead 2A and the lead 2B that is exposed from the bottom surface of the recess of the resin package 3 (which may be referred to as "exposed portion of the lead" hereinafter), a portion of the exposed portion of the lead is covered by the second protective film 6 but not covered by the first protective film 5, and the other portion of the exposed portion of the lead is covered by both of the first protective film 5 and the second protective film 6 (via the first protective film 5). This will be described below with reference to FIG. 2C. The first protective film 5 continuously coveting the resin package 3 (including the lead 2A and the lead 2A), the die-bonding resin 4, the lateral surfaces of the light emitting element 1, and the upper surface (first surface) of the light emitting element is preferably formed using a method in which a film-forming material transfers highly rectilinearly from a supplying source of a film-forming material to a portion of a member on which a film is to be formed, such as sputtering. In particular, forming the first protective film 5 using sputtering allows for forming the first protective film 5 having high adhesiveness with low cost. High adhesiveness between the die-bonding resin 4 and the first protective film 5 can reduce detachment. If the die-bonding resin 4 is detached from the first protective film 5, shear strain and bending moment may be applied on the first protective film 5, which may lead to generation of a crack. Accordingly, it is preferable to prevent detachment.

However, in the case of using the method in which a material transfers highly rectilinearly, if a wire or the like is present on a line connecting a supplying source of a film-funning material and a portion of a member on which a film is to be formed, particularly near the portion to which the film is to be formed, the wire or the like serve as an obstacle, and the film may not be formed on a portion masked by the obstacle. For example, as illustrated in FIG. 2C, the first protective film 5 is not formed on a surface of the lead 2A at a portion near a contacting portion between the bump 17A and the lead 2A, where the bump 17A is a connecting portion that connects the wire 7A and the lead 2A. That is, at a portion directly below a swelling portion of the bump 17A relative to the contacting portion of the bump 17A and the lead 2A, the first protective film 5 is not formed on the surface of the lead 2A.

On the other hand, the second protective film 6 is preferably formed using the atomic layer deposition method. In the atomic layer deposition method, a film-forming material is supplied in the form of gases, so that the film-forming material transfers with low rectilinearity from a supplying source of a film-forming material to a portion of a member on which a film is to be formed, which allows the protective film to be easily formed even on a portion that is shaded by the obstacle. In FIG. 2C, the second protective film 6 is formed also on the portion of the lead 2A on which the first protective film 5 is not formed near the contacting portion between the bump 17A and the lead 2A. That is, the second protective film 6 covers a portion of the lead 2A between the connecting portion connecting the wire 7A and the conductive member (lead) 2A (i.e., the bump 17) and the first protective film 5. In this manner, the shaded portion can be sufficiently covered by the protective film, so that discoloration of the leads can be more greatly reduced.

Figure 3:
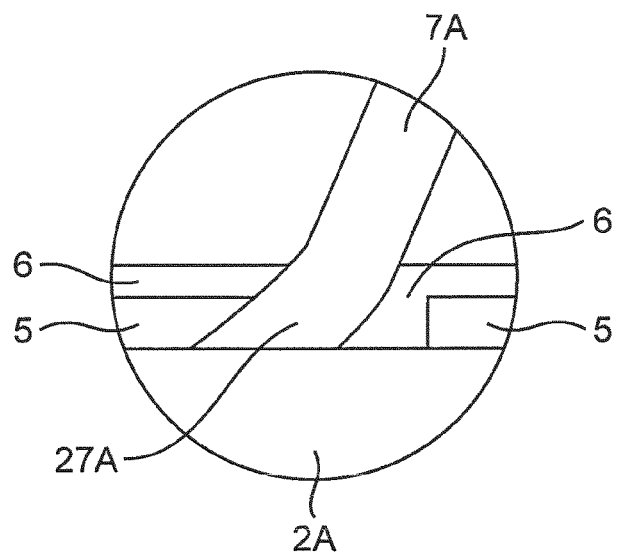
FIG. 3 is a schematic cross-sectional view illustrating another form of arrangement of a first protective film and a second protective film 6 near a portion connecting a wire 7A and a lead 2A.

In the embodiment illustrated in FIG. 2C, the bump 17 is formed to be used as the connecting portion connecting the wire 7A and the lead 2A, but the bump 17 is not limited to this configuration. FIG. 3 is a schematic cross-sectional view illustrating another form of a first protective film 5 and a second protective film 6 near the connecting portion connecting a wire 7A and a lead 2A. In the embodiment illustrated in FIG. 3, the bump is not used, and a wire-bonding part 27A, which is the connecting portion connecting the lead 2A and the wire 7A, is formed. Examples of a method for forming such connecting portion can include wedge bonding. In FIG. 3, a portion of the lead 2A directly below the wire 7A near the connecting portion connecting the lead 2A and the wire 7A are shaded, and the first protective film 5 is not formed on the shaded portion. Further, the second protective film 6 is formed also on the portion of the lead 2A on which the first protective film 5 is not formed. That is, the second protective film 6 covers a portion of the lead 2A between the connecting portion connecting a wire 7A and the conductive member (lead) 2A and the first protective film 5.

In the embodiment shown in FIG. 1 to FIG. 3, the conductive member (leads) 2A and 2B and the light emitting element 1 are electrically connected using the wire 7A and 7B, but the conductive member (leads) 2A and 2B and the light emitting element 1 may be electrically connected without using at least one of the wire 7A and 7B. For example, one of a positive electrode and a negative electrode may be formed on the lower surface of the light emitting element 1, and the electrode formed on the lower surface of the light emitting element 1 may be electrically connected to the conductive member in a flip-chip mounting manner.

A sealing resin 12 may be filled in the recess of the resin package 3 in which the first protective film 5 and the second protective film are formed in this manner. The sealing resin 12 may contain a wavelength converting material for converting wavelength of light emitted from the fight emitting element 1. Examples of the wavelength converting material include one or more kinds of phosphor. Phosphor may include a quantum dot. In the description below, some of components other than the first protective element 5 and the second protective element 6 are illustrated in detail.

Light Emitting Element

The light emitting element may be a known appropriate light emitting element, and for example, may be an LED chip. In the case where the sealing resin 12 contains wavelength converting material, preferably, the light emitting element 1 is a an element emitting blue light, such as a blue LED chip. In this case, the light emitting element 1 may include a semiconductor layered body, and preferably includes a nitride semiconductor layered body. The semiconductor layered body (preferably, the nitride semiconductor layered body) may include a first semiconductor layer (e.g., an n-type semiconductor layer), a light emitting layer, and a second semiconductor layer (e.g., a p-type semiconductor layer). As a preferable nitride semiconductor material for the nitride semiconductor layered body, specifically, $In_XAl_YGa_{1-X-Y}N$ ($0 \leq X$, $0 \leq Y$, $0 \leq X+Y < 1$) may be used. Each layer may have a thickness or a structure that is known in the art.

Resin Package

The resin package 3 may be made of any appropriate kind of resin. Examples of such resin preferably used fir the resin package 3 includes a thermoplastic resin including one or more of an aromatic polyamide resin, a polyester resin, and a liquid crystal resin, or a thermosetting resin including one or more of an epoxy resin, a modified epoxy resin, a phenol resin, a silicone resin, a modified silicone resin, a hybrid resin, an acrylate resin, and an urethane resin. The resin package 3 is preferably made of a white resin. This is because such resin can reflect light that reaches the resin package 3.

Wire

For the wires 7A and 7B, a material having good ohmic property, mechanical connectivity, electric conductivity, and thermal conductivity with the conductive member (lead 2A and 2B) is preferably used. Examples of the wires 7A and 7B include conductive wires using a metal such as gold, copper, platinum, or aluminum, or alloy of these.

Sealing Resin

The sealing resin 12 can transmit light emitted by the light emitting element 1. In the case of using the wavelength converting material, the sealing resin 12 can transmit also light emitted by the wavelength converting material. Examples of a resin preferably used for the sealing resin 12 include a resin such as a silicone resin, a silicone-modified resin, art epoxy resin, an epoxy-modified resin, a phenol resin, a polycarbonate resin, an acrylic resin, a TPX resin, a polynorbornene resin, or a hybrid resin which contains one or more of those. Among these, a silicone resin or an epoxy resin is preferable, and particularly, a silicone resin, which has good light resistant property and heat resistant property, is more preferable.

Wavelength Converting Material

For the wavelength converting material, a phosphor mar be used. Specific examples of the phosphor include a yellow-light emitting phosphor such as a YAG-based phosphor activated with cerium, a LAG-based phosphor activated with cerium, and a silicate-based phosphor such as (Sr, Ba)$_2$SiO$_4$:Eu, and a combination of those. Further, the phosphor is not limited to be a yellow-light emitting phosphor, but a phosphor with desired light emission spectrum may be used. For example, various phosphor such as a nitride-based or oxynitride-based phosphor (e.g., a CASN-based phosphor, an SCASN-based phosphor, an α-SiAlON based phosphor, or β-SiAlON based phosphor), a halogen-based phosphor (e.g. Chlorosilicate phosphor or KSF-based phosphor), or a sulfide-based phosphor may be used for the phosphor. Also, quantum dots may be used for the phosphor. Two or more of these phosphors may be used in combination.

1-2. Method of Manufacturing Light Emitting Device 100

FIGS. 4A to 4F are schematic cross-sectional views illustrating a method of manufacturing the light emitting device 100. With reference to FIGS. 4A to 4F, details of the method of manufacturing are illustrated below.

Providing Base Member

Figure 4A:
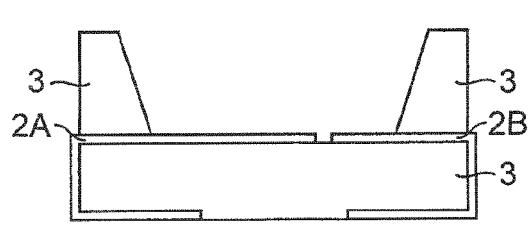
FIGS. 4A to 4F are schematic cross-sectional views illustrating a method of manufacturing a light emitting device 100.

As illustrated in FIG. 4A, the resin package 3 including the lead 2A and the lead 2B is provided, the conductive member to be the lead 2A and the lead 2A is arranged in a package-forming mold, and a resin to be a material of the resin package is poured into the mold and hardened, so that the resin package 3 including the lead 2A and the lead 2B can be formed. On a surface of each of the lead 2A and die lead 2A, a light reflective film may be formed as needed. While the lead 2A and 2B are cut and bent to form a portion along a lateral surface or the lower surface of the resin package 3 in the embodiment shown in FIG. 4A, such cutting and bending may be performed in an appropriate timing such as after forming the sealing member described below.

Arranging Light Emitting Element

Figure 4B:
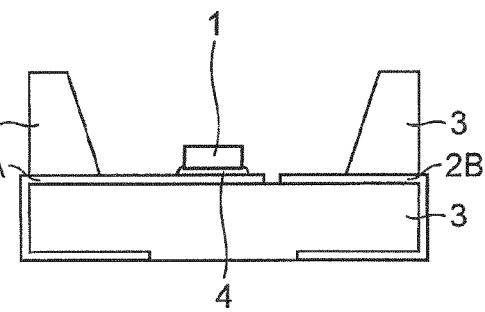

Next, as shown in FIG. 4B, the light emitting element 1 is arranged on the lead 2A. More specifically, the lower surface of the light emitting element 1 is bonded (fixed) to the lend 2A via the die-bonding resin 4. As shown in FIG. 4B, in order to bond the light emitting element 1 and the lead 2A more securely, the die-bonding resin 4 may be arranged to extend to outside of the lower surface of the light emitting element.

Connecting Wire

Figure 4C:
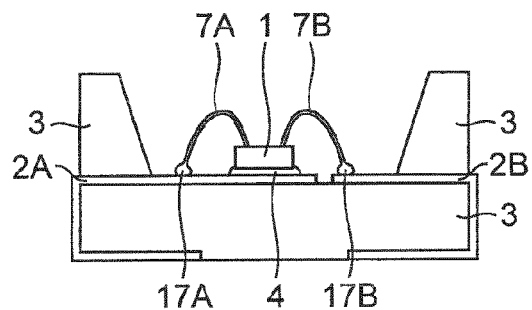

Next, as shown in FIG. 4C, the light emitting element 1 and the lead 2A are electrically connected using the wire 7A. The bump 17A is formed on the lead 2A. One end of the wire 7A is connected to the lead 2A via the hump 17A, and the other end of the wire 7A is wire-bonded to one of the positive electrode and the negative electrode arranged on the upper surface (first surface) of the light emitting element 1. Also, the bump 17B is formed on the lead 2B. One end of the wire 7B is connected to the lead 2B via the bump 17B, and the other end of the wire 7B is wire-bonded to the other of the positive electrode and the negative electrode arranged on the upper surface (first surface) of the light emitting element 1.

Forming First Protective Film

Figure 4D:
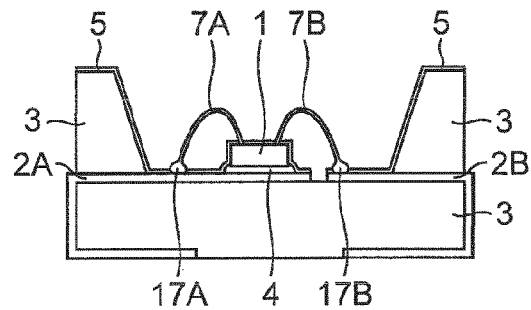

Next, as shown in FIG. 4D, the first protective film 5, which continuously covers the resin package 3 (including the lead 2A and the lead 2B), the die-bonding resin 4, the lateral surfaces of the light emitting element 1, and the upper surface (first surface) of the light emitting element 1, is formed. The first protective film 5 is preferably formed using a method in which a film-forming material transfers highly rectilinearly from a supplying source of a film-forming material to a portion of a member on which a film is to be formed, such as sputtering. In this case, near the contacting portion between the hump 17A and the lead 2A, or near the contacting portion between the bump 17B and the lead 2B, a surface of the lead 2A may include a portion on which the first protective film 5 is not formed.

Forming Second Protective Film

Figure 4E:
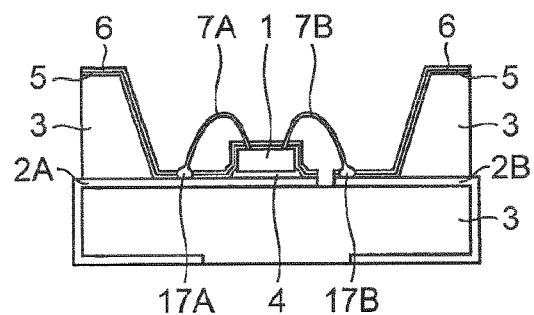

Next, as shown in FIG. 4E, the second protective film 6 which continuously covers the resin package 3 (including the lead 2A and the lead 2B), the die-bonding, resin 4, the lateral surfaces of the light emitting element 1, and the upper surface (first surface of the light emitting element 1 via the first protective film 5, is formed. Preferably, the second protective film is formed using atomic layer deposition method. In the case of using atomic layer deposition method, the second protective film 6 can be formed also on portions where the first protective film 5 is not formed, which is near the contacting portion between the hump 17A and the lead 2A and near the contacting portion between the bump 17B and the lead 2B.

An example of forming an aluminum oxide film as the second protective film 6 using atomic layer deposition method is illustrated below. First, trimetriyialuminium (TMA) gas is introduced so that the OH groups on a surface of base member 3, which is the target, is allowed to reacted with TMA (first reaction). Next, excess gas is evacuated. Then, H$_2$O gas is introduced so that the TMA combined with the OH groups in the first reaction is allowed to react with the H$_2$O (second reaction). Next, excess gas is evacuated. The first reaction, evacuation, the second reaction, and evacuation are taken as one cycle, and the cycle is repeated a plurality of times. Thus, a film of aluminum oxide (Al$_2$O$_3$) of a predetermined thickness can be formed.

Forming Sealing Member

Figure 4F:
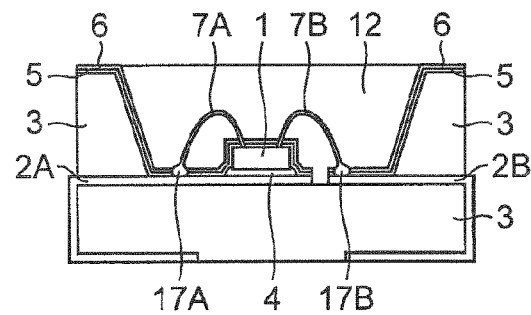

As shown in FIG. 4F, the sealing resin (sealing member) 12 may be formed in the recess of the resin package 3, as necessary.

2. Embodiment 2

Figure 5A:
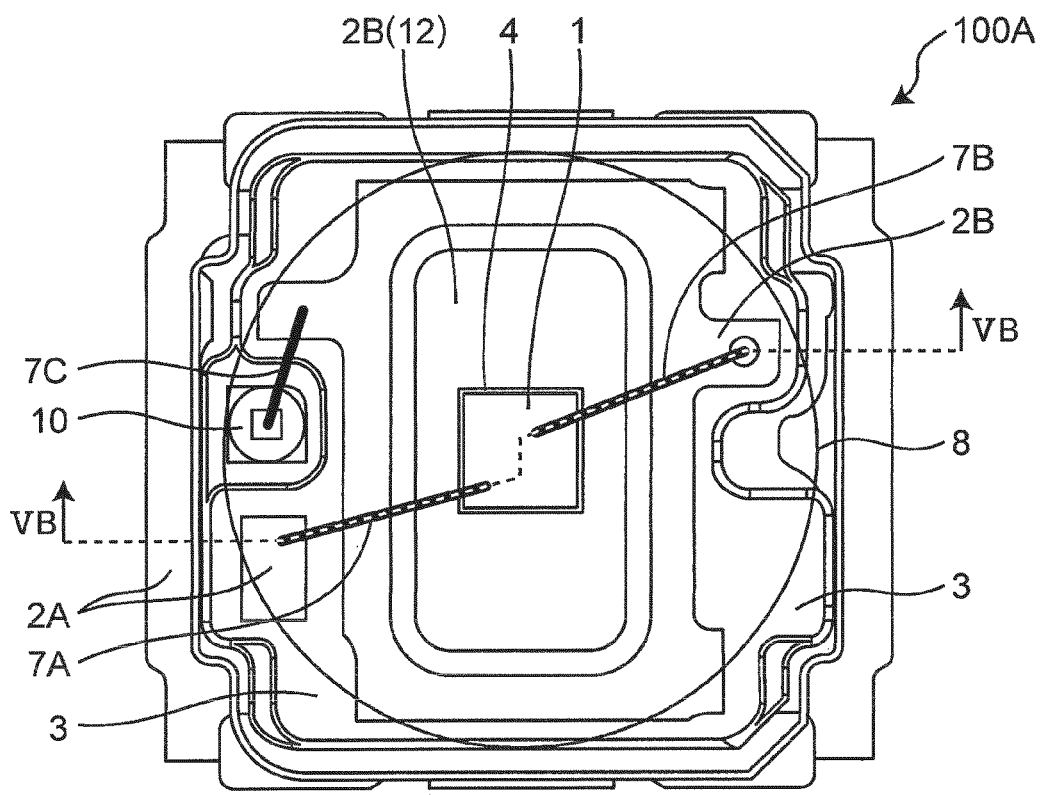
FIG. 5A is a schematic top view of a light emitting device 100A according to Embodiment 2.
Figure 5B:
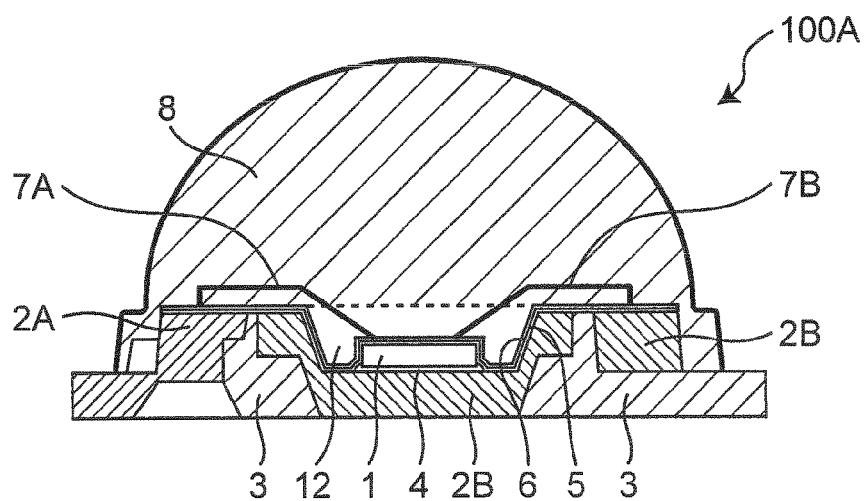
FIG. 5B is a schematic cross-sectional view showing a cross section at VB-VB in FIG. 5A.

FIG. 5A is a schematic top view of a light emitting device 100A according to Embodiment 2, and FIG. 5B is a schematic cross-sectional view showing a cross section at VB-VB in FIG. 5A. In the description below, configurations different from that in Embodiment 1 are mainly illustrated. Unless otherwise specified in the description below, each component in the present embodiment may have a structure similar to that of respective component in Embodiment 1.

Similarly to the light emitting device 100, a base member (resin package) 3 of the light emitting device 100A includes a lead 2A and a lead 2B. In the light emitting device 100A, the lead 2B includes a recess, and a light emitting element 1 is arranged inside the recess of the lead 2B. The light emitting element 1 has a lower surface (a second surface), which is bonded to a bottom surface of the recess of the lead 2B via a die-bonding resin 4. That is, in the light emitting device 100A, the recess of the lead 2B corresponds to a recess of the resin package 3, and the bottom surface of the recess of the lead 2B corresponds to a bottom surface of a recess of the resin package 3.

The light emitting device 100A is similar to the light emitting device 100 in that the first protective film 5 continuously covering the base member (resin package) 3, the die-bonding resin 4, lateral surfaces of the light emitting element 1, and an upper surface (first surface) of the light emitting element 1 is arranged, and that the second protective film 6 is arranged over the first protective film 5 so as to continuously cover the base member (resin package) 3, the die-bonding resin 4, the lateral surfaces of the light emitting element 1, and the upper surface (first surface) of the light emitting element 1 via the first protective film 5. In the embodiment shown in FIG. 5A and FIG. 5B, an upper surface of each of the lead 2A and the lead 2B, lateral surfaces and the bottom surface of the recess of the lead 2B, and an upper surface of a resin part of the resin package 3 are covered by at least one of the first protective film 5 and the second protective film 6.

A connecting portion connecting the wire 7A and the conductive member (lead) 2A is located on an upper side relative to a connecting portion connecting the conductive member (lead) 2A and the light emitting element 1. That is, the connecting portion connecting the wire 7A and the conductive member (lead) 2A and the connecting portion connecting the conductive member (lead) 2A and the light emitting element 1 are not in the same plane, so that heat from the light emitting element less easily transfers to the portion connecting the wire 7A and the conductive member (lead) 2A. Accordingly, detachment between the wire 7A and the conductive member (lead) 2A can be reduced.

The light emitting device 100A includes a protective element 10, as shown in FIG. 5A. The protective element 10 is electrically connected to the lead 2B via a wire 7C. In the light emitting device 100A, a portion of an upper surface of the resin package 3 (in the embodiment shown in FIG. 5A and FIG. 5B, an upper surface of each of the lead 2A, the lead 2B, and the upper surface of the resin part of the resin package 3) is covered by an outer resin 8. In the embodiment shown in FIG. 5A and FIG. 5B, a portion of each of the wires 7A, 7C, and 7C, is covered by the outer resin 8. As shown in FIG. 5B, for example, in the case where the outer resin 8 has a predetermined shape such as a convex facing upward, the outer resin 8 can be used as a lens. Also in the light emitting device 100 of Embodiment 1, such protective element 10 and/or the outer resin 8 may be arranged.

Variant Example

Figure 6A:
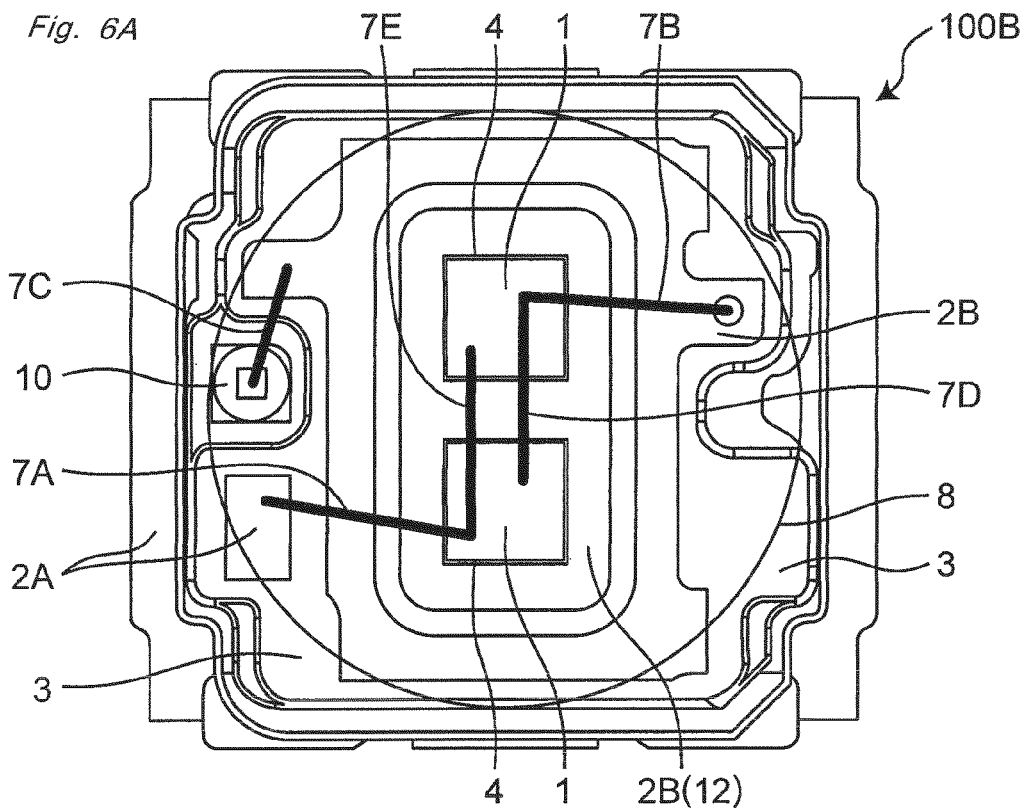
FIG. 6A is a schematic top view of a light emitting device 100B according to Variant Example 1 of the light emitting element 100A.
Figure 6B:
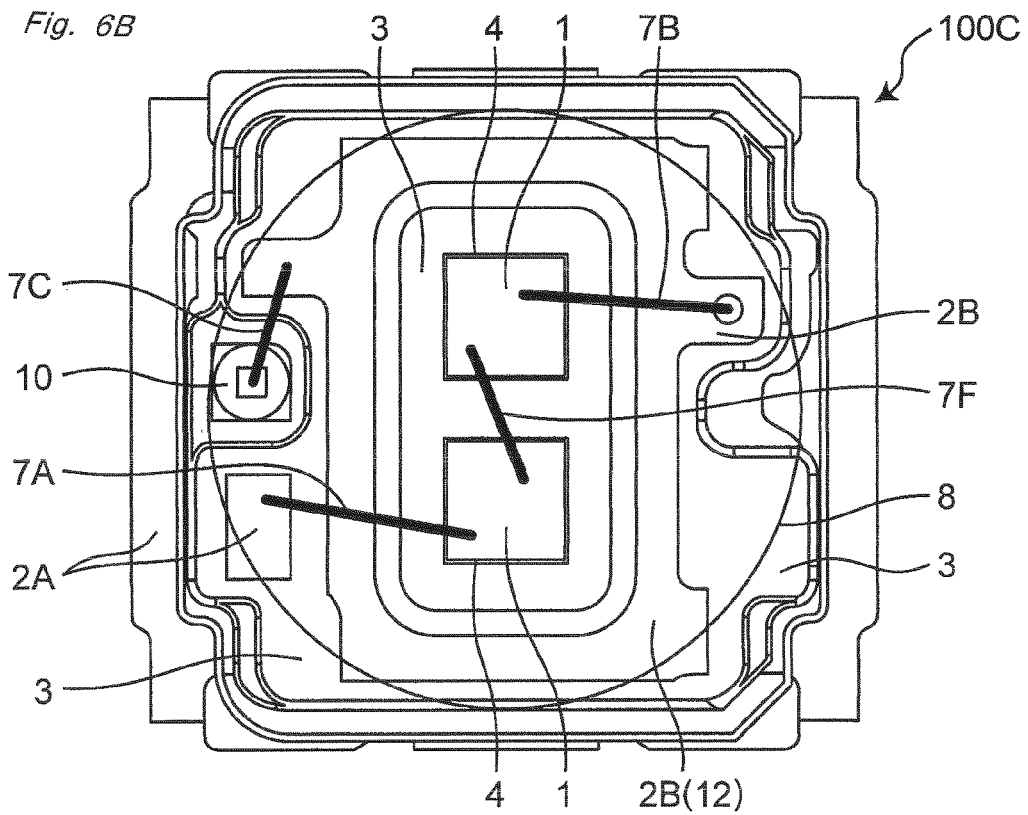
FIG. 6B is a schematic top view of a light emitting device 100C according to Variant Example 2 of the light emitting device 100A.

FIG. 6A is a schematic top view of a light emitting device 100B according to Variant Example 1 of the tight emitting element 100A, and FIG. 6B is a schematic top view of a light emitting device 100C according to Variant Example 2 of the light emitting device 100A. The light emitting device 100C will be described below mainly regarding different configurations from the light emitting device 100B. Unless otherwise specified in the description below, each component of the light emitting device 100B and the light emitting device 100 may have a structure similar to that of respective component of the light emitting device 100A.

In the light emitting device 100B, a plurality of light emitting elements 1 (in FIG. 6A, two light emitting elements) are arranged in a recess of a lead 2B. Each of the light emitting elements 1 has a lower surface (a second surface), which is bonded to a bottom surface of the recess of the lead 2B via a die-bonding resin 4.

In the embodiment shown in FIG. 6A, one of the two light emitting elements 1 (lower-side light emitting element in FIG. 6A) and a lead 2A are electrically connected via a wire 7A. An electrode of the lower side light emitting element 1 to which the wire 7A is connected and an electrode of the other of light emitting element 1 (upper-side light emitting element 1) having the same polarity with that of the electrode of the lower side light emitting element 1 to which the wire 7A is connected are electrically connected via a wire 7E. An electrode of the upper-side light emitting element 1 and the lead 2B are electrically connected via a wire 7B. That is, an electrode having different polarity from the polarity of the electrodes to which the wire 7E is connected is electrically connected with the lead 2B via the wire 7B. An electrode of the upper-side light emitting element 1 to which the wire 7B is connected and an electrode of the lower-side light emitting element 1 having the same polarity with that of the electrode of the upper-side light emitting element 1 to which the wire 7B is connected are electrically connected via a wire 7D.

In the light emitting device 100C, similarly to in the light emitting device 100B, a plurality of light emitting elements 1 (in FIG. 6C, two light emitting elements 1) are arranged in a recess of a lead 2B. On the other hand, a manner of electrically-connecting the light emitting elements via wires is different from that in the light emitting device 100B. In the embodiment shown in FIG. 6B, one of the two light emitting elements 1 (lower-side light emitting element in FIG. 6B) and the lead 2A are electrically connected via the wire 7A. An electrode of an upper-side light emitting element 1 and the lead 2B are electrically connected via a wire 7B. That is, an electrode having different polarity from that of the electrode to which the wire 7A is connected are electrically connected with the lead 2A via the wire 7B. An electrode of the lower-side light emitting element 1 to which the wire 7B is not connected, i.e., an electrode having different polarity from that of the electrode to which the wire 7A is connected, and an electrode of the lower-side light emitting element 1 to which the wire 7B is not connected, i.e., an electrode having different polarity from that of the electrode to which the wire 7B is connected, are electrically connected via a wire 7F.

It is to be understood that although the present invention has been described with regard to preferred embodiments thereof, various other embodiments and variants may occur to those skilled in the art, which are within the scope and spirit of the invention, and such other embodiments and variants are intended to be covered by the following claims.

What is claimed is:
1. A light emitting device comprising:
  a base member including a conductive member;
  a light emitting element arranged on the base member, the light emitting element having a first surface, a second surface opposing the first surface, and at least one lateral surface between the first surface and the second surface;
  a die-bonding resin bonding the base member and the second surface;
  a first protective film continuously covering the base member, the die-bonding resin, the at least one lateral surface, and the first surface; and
  a second protective film continuously covering the base member, the die-bonding resin, the at least one lateral surface and the first surface of the light emitting element, over the first protective film, the second protective film having a linear expansion coefficient that is smaller than a linear expansion coefficient of the die-bonding resin and larger than a linear expansion coefficient of the first protective film.

2. The light emitting device according to claim 1, further comprising:
  a wire electrically connecting the light emitting element and the conductive member; and
  a connecting portion connecting the wire and the conductive member, wherein the second protective film covers a portion of the conductive member that is between the connecting portion and the first protective film.

3. The light emitting device according to claim 1, wherein the linear expansion coefficient of the first protective film is in a range of 0.5 ppm to 0.7 ppm, the linear expansion coefficient of the second protective film is in a range of 7 ppm to 8 ppm, and the linear expansion coefficient of the die-bonding resin is in a range of 200 ppm to 220 ppm.

4. The light emitting device according to claim 1, wherein the first protective film has an elastic modulus in a range of 69 GPa to 76 GPa, the second protective film has an elastic modulus in a range of 350 GPa to 420 GPa, and the die-bonding resin has an elastic modulus in a range of 0.11 GPa to 0.13 GPa.

5. The light emitting device according to claim 1, wherein the first protective film has a thickness in a range of 40 nm to 80 nm, and the second protective film has a thickness in a range of 40 nm to 60 nm.

6. The light emitting device according to claim 1, wherein the first protective film is made of silicon oxide, and the second protective film is made of aluminum oxide.

7. The light emitting device according to claim 1, wherein the first protective film includes a pinhole, and the pinhole is filled with the second protective film.

8. A method of manufacturing a light emitting device, the method comprising:
bonding a light emitting element and a base member using a die-bonding resin, the base member including a conductive member;
forming a first protective film, the first protective film continuously covering the base member, the die-bonding resin, and the light emitting element;
forming a second protective film, the second protective film covering the base member, the die-bonding resin, and a surface of the light emitting element via the first protective film, and the second protective film having a linear expansion coefficient that is smaller than a linear expansion coefficient of the die-bonding resin and larger than a linear expansion coefficient of the first protective film.

9. The method according to claim 8, wherein the first protective film is formed by sputtering, and the second protective film is formed using an atomic layer deposition method.

10. The method according to claim 8, further comprising, before the step of forming the second protective film, electrically connecting the light emitting element and the conductive member via a wire.

11. The method according to claim 10, wherein the light emitting element comprises a connecting portion connecting the wire and the conductive member, and the step of forming the second protective film is performed such that the second protective film covers a portion of the conductive member that is between the connecting portion and the first protective film.

12. The method according to claim 8, wherein the first protective film has a thickness in a range of 40 nm to 80 nm, and the second protective film has a thickness in a range of 40 nm to 60 nm.

13. The method according to claim 8, wherein the first protective film is made of silicon oxide, and the second protective film is made of aluminum oxide.

* * * * *